(12) United States Patent
Tang et al.

(10) Patent No.: US 7,511,359 B2
(45) Date of Patent: Mar. 31, 2009

(54) DUAL DIE PACKAGE WITH HIGH-SPEED INTERCONNECT

(75) Inventors: John J. Tang, Shanghai (CN); Xiang Yin Zeng, Shanghai (CN); Jiangqi He, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 387 days.

(21) Appl. No.: 11/321,195

(22) Filed: Dec. 29, 2005

(65) Prior Publication Data

US 2007/0152312 A1 Jul. 5, 2007

(51) Int. Cl.
*H01L 23/12* (2006.01)
(52) U.S. Cl. .................. 257/621; 257/686; 257/707; 257/723; 257/E23.062; 174/262; 361/783
(58) Field of Classification Search .................. 257/621
See application file for complete search history.

(56) References Cited

U.S. PATENT DOCUMENTS

| | | | | |
|---|---|---|---|---|
| 6,037,659 A | * | 3/2000 | Weixel | 257/717 |
| 6,388,320 B2 | * | 5/2002 | Smola et al. | 257/724 |
| 6,472,732 B1 | * | 10/2002 | Terui | 257/678 |
| 6,563,712 B2 | * | 5/2003 | Akram et al. | 361/719 |
| 6,787,923 B2 | * | 9/2004 | Tan et al. | 257/779 |
| 6,815,256 B2 | | 11/2004 | Figueroa et al. | |
| 7,122,901 B2 | * | 10/2006 | Sunohara et al. | 257/758 |
| 2003/0080411 A1 | * | 5/2003 | Baek et al. | 257/704 |
| 2004/0021210 A1 | * | 2/2004 | Hosomi | 257/686 |
| 2004/0262777 A1 | * | 12/2004 | Kim et al. | 257/778 |

OTHER PUBLICATIONS

U.S. Appl. No. 11/301,606; Titled Copper Plating Connection for Multi-Die Stack in Substarte Package; filed Dec. 12, 2006, Inventor: John J. Tang.

* cited by examiner

*Primary Examiner*—Stephen W Smoot
(74) *Attorney, Agent, or Firm*—Blakely, Sokoloff, Taylor & Zafman LLP

(57) ABSTRACT

Embodiments of the invention relate to the construction of a dual die package with a high-speed interconnect. A package is created having a first die on a first side of a base substrate and a second die on a second side of the base substrate in opposed relation to the first die. A first copper plated interconnect is plated to the base substrate. Second copper interconnects are formed to connect the first copper plated interconnect to the first and second dice, respectively, such that the first and second dice are interconnected.

10 Claims, 6 Drawing Sheets

DUAL DIE PACKAGE WITH HIGH-SPEED INTERCONNECT

BACKGROUND

1. Field of the Invention

Embodiments of the invention relate to the field of semiconductors, and more particularly, to semiconductor manufacturing or fabrication.

2. Description of Related Art

As the speed and density of semiconductor integrated circuits has increased, consequent thermal and electrical connectivity issues have raised the requirements for packaging. Typically, an integrated circuit die is mounted on a silicon building block, which in turn may be mounted on a plastic, or other material, substrate or package. This entire apparatus is then mounted on a printed circuit board.

Mounting to the printed circuit board generally involves a ball grid array or pin grid array and wiring to complete the electrical connection between the integrated circuit and the printed circuit board.

In particular, thermal and electrical connectivity issues have become increasingly important in the packaging realm in relation to graphics processing and dual central processing unit (CPU) systems.

For example, as to graphics processing, especially 3-D graphics processing, communication between a memory controller and an associated high-speed memory is required to be at very high speed and requires a great deal of bandwidth. Current configurations between a typical memory controller and a memory through a motherboard results in large latencies, and the overall large electrical parasitics restrict the electrical performance, and thus, current configurations are less than desirable for high speed 3-D graphics processing.

For example, with reference to FIG. 1A, a typical configuration is shown in which a memory controller 12 is connected through a motherboard 14 to a memory 16. As can be seen, this typical configuration utilizes a ball grid array 20 and wiring 23 to complete the electrical connections between the memory controller 12 and the memory 16 through the motherboard 14. Unfortunately, the latencies inherent in this type of configuration do not lend themselves to the high speed and large bandwidth requirements for intense 3-D graphics processing.

Similarly, for current dual CPU packages, an example of which is shown in FIG. 1B, the interconnect for the non-active CPU 40 or 42 may often show a stub effect when the other CPU 40 or 42 is active. This stub effect typically restricts the highest speed for the interconnection due to resonant phenomenon.

This type of typical configuration includes a first CPU 40, a second CPU 42, and an interconnect having a ball grid array 50 and wiring 51 to complete the electrical connections between the CPUs and through the package 55. Unfortunately, the stub effects between CPUs 40 and 42 impact the electrical performance significantly as input/output (I/O) speed increases.

As described above, typical packaging and mounting of dual die packages utilizing common ball grid arrays has become less desirable due to the increased need for high-speed electrical performance. One reason for this, as described above, is due to the long interconnections, causing high signal latency and therefore reducing operating frequency. Further, for dual die packages, using current packaging methods, overall manufacturing costs may be high due to wire bonding, molding, and other assembly tasks.

BRIEF DESCRIPTION OF THE DRAWINGS

Embodiments of invention may best be understood by referring to the following description and accompanying drawings that are used to illustrate embodiments of the invention. In the drawings.

DESCRIPTION

In the following description, numerous specific details are set forth. However, it is understood that embodiments of the invention may be practiced without these specific details. In other instances, well-known circuits, structures, and techniques have not been shown to avoid obscuring the understanding of this description.

One embodiment of the invention may be described as a process which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a program, a procedure, a method of manufacturing or fabrication, etc.

An embodiment of the present invention relates to techniques to construct a dual die package with a high-speed interconnect. In one embodiment, a dual die package is created having a first die on a first side of a base substrate and a second die on a second side of the base substrate in opposed relation to the first die. A first copper plated interconnect is plated to the base substrate. Second copper interconnects are formed to connect the first copper plated interconnect to the first and second dice, respectively, such that the first and second dice are interconnected.

For example, the dual dice may be two central processing units or may be a memory controller and a memory chip. The dice may be embedded step-by-step in a substrate buildup. Copper plating may be used to connect each die to the substrate and each of the dice to one another. As will be described, in this dual die configuration, the interconnection between the dice can be very short, resulting in small electrical parasitics, and fast electrical response time. Therefore, a high level of electrical performance is provided.

Normal processes and existing equipment may be used in this packaging process such that it is low cost. Further, by forming dual dice in the same package, a number of advantages compared to traditional techniques (e.g., wire-bonding or flip-chip packing) may be realized. For example, the electrical response time is faster because the dice are integrated in the same package, with very short connection lengths. Also, costs associated with the use of gold wires, wire-bonding, and ball attachment are obviated. Additionally, the resulting package occupies much less space, in terms of both area and height.

Figure 1A:
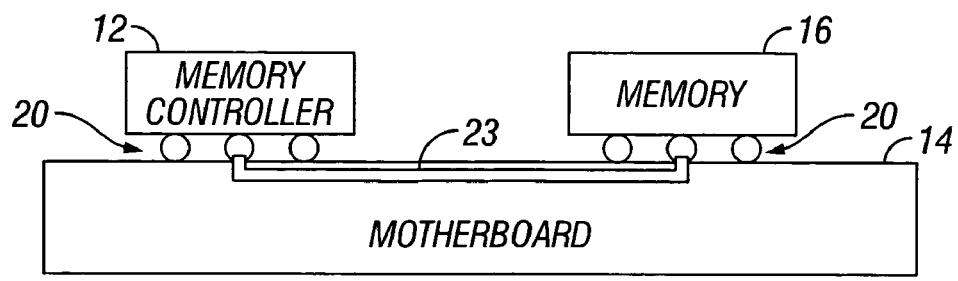
FIG. 1A is a diagram illustrating a typical package configuration for a memory controller and memory package.
Figure 1B:
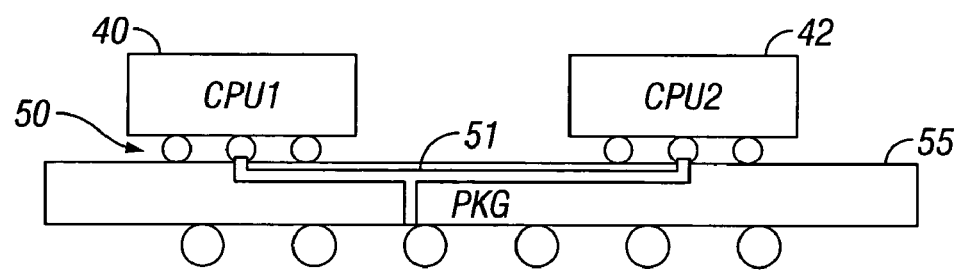
FIG. 1B is a diagram illustrating a typical package configuration for a dual CPU package.
Figure 2:
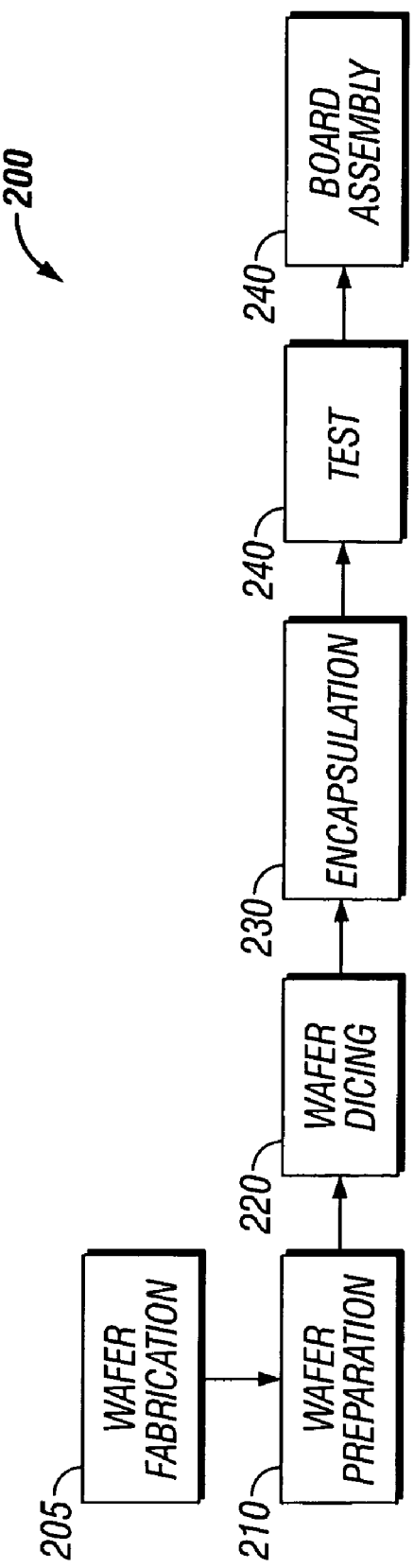
FIG. 2 is a diagram illustrating a system in which one embodiment of the invention can be practiced.

FIG. 2 is a diagram illustrating a system 200 in which one embodiment of the invention may be practiced. The system 200 includes a wafer fabrication phase 205, a wafer preparation phase 210, a wafer dicing phase 220, an encapsulation phase 230, a testing phase 240, and a board assembly phase 250. The system 200 represents a manufacturing flow of a semiconductor packaging process.

The wafer fabrication phase 205 fabricates the wafer containing a number of dice. The individual dice may be any microelectronic devices such as microprocessors, central processing units (CPUs), memory controllers, memory devices, interface circuits, etc. The wafer fabrication phase 205 includes typical processes for semiconductor fabrication such as preparation of the wafer surface, growth of silicon dioxide ($SiO_2$), patterning and subsequent implantation or diffusion of dopants to obtain the desired electrical properties, growth or deposition of a gate dielectric, and growth or deposition of insulating materials, depositing layers of metal and insulating material and etching it into the desired patterns. Typically the metal layers consist of aluminium or more recently copper. The various metal layers are interconnected by etching holes, called "vias," in the insulating material.

The wafer preparation phase 210 prepares a wafer containing dice for packaging and testing. During this phase, the wafers are sorted after the patterning process. An inspection may be carried out to check for wafer defects. Then, the wafer may be mounted on a backing tape that adheres to the back of the wafer. The mounting tape provides mechanical support for handling during subsequent phases.

The wafer dicing phase 220 dices, cuts, or saws the wafer into individual dice. High precision saw blade and image recognition unit may be used. De-ionized water may be dispensed on the wafer to wash away any residual particles or contaminants during the dicing. Then, the wafer is dried by being spun at high spinning speed.

The encapsulation phase 230 encapsulates the dice and the substrate layers. The dice may be homogeneous or heterogeneous. A number of dices (e.g. a pair of dice) may be interconnected using copper plating. Integrated heat spreader (IHS) may be attached to the die and substrate assembly. The encapsulated assembly of the dice and substrate layers becomes a package ready to be tested.

The testing phase 240 performs one or more tests on the package under various conditions. The test may be highly accelerated stress test (HAST) or biased-HAST. The package may be powered or non-powered. The testing phase 240 may be optional.

The board assembly phase 250 assembles the package into a printed circuit board. This phase attaches the dual die package to the board. This phase may include various soldering processes, reflow, testing, and inspection. The assembled board is then installed into a platform in a system or unit.

An embodiment of the present invention relates to techniques to construct a dual die package with a high-speed interconnect. In one embodiment, a dual die package is created having a first die on a first side of a base substrate and a second die on a second side of the base substrate in opposed relation to the first die. A first copper plated interconnect is plated to the base substrate. Second copper interconnects are formed to connect the first copper plated interconnect to the first and second dice, respectively, such that the first and second dice are interconnected.

For example, the dual dice may be two central processing units or may be a memory controller and a memory chip. The dice may be embedded step-by-step in a substrate buildup. Copper plating may be used to connect each die to the substrate and each of the dice to one another. As will be described, in this dual die configuration, the interconnection between the dice can be very short, resulting in small electrical parasitics, and fast electrical response time. Therefore, a high level of electrical performance is provided.

As will be described, thin dice may be embedded in the build-up layer in the substrate manufacturing process. Die-to-die and die-to-substrate interconnection is enabled by copper plating in the substrate build-up layer when the copper layer is fabricated during the normal substrate process.

Figure 3A:
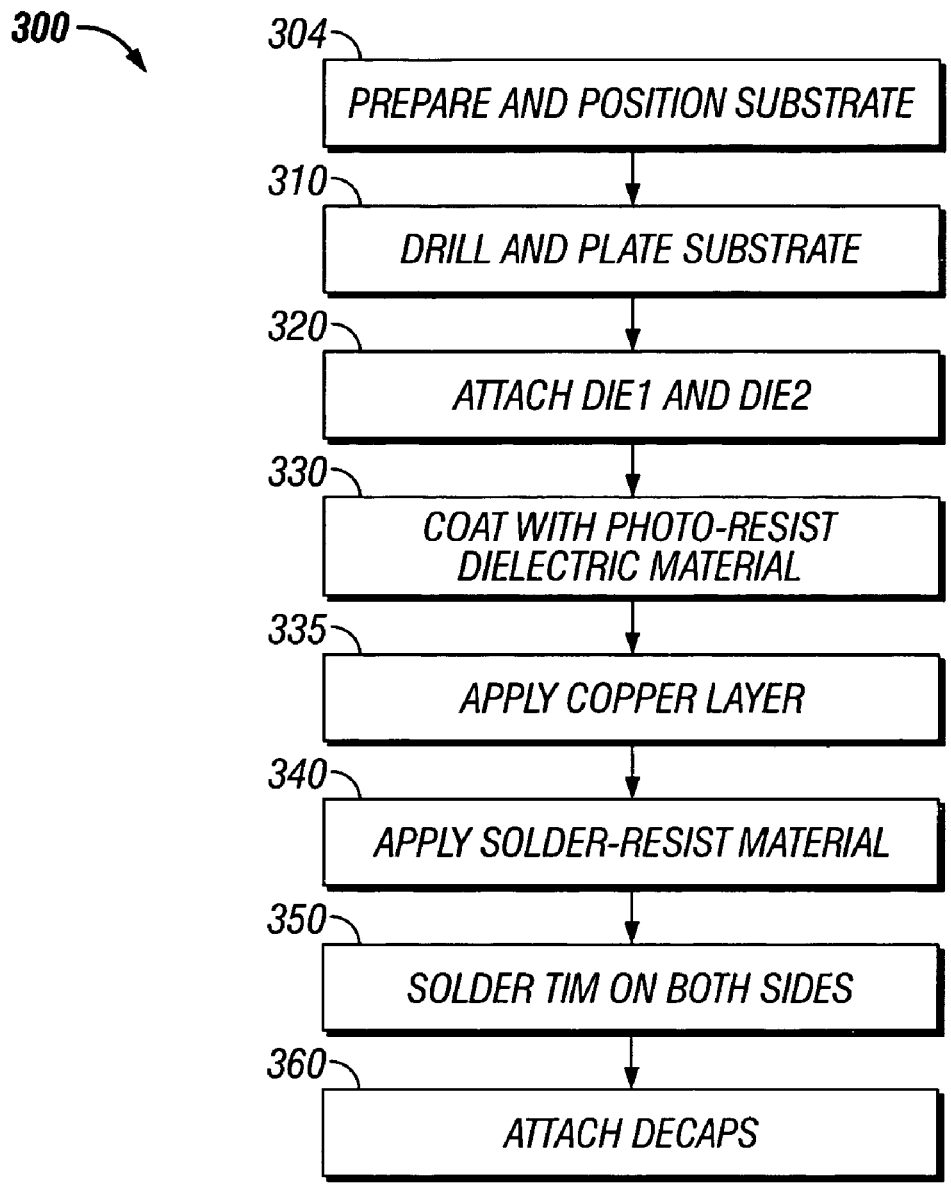
FIG. 3A is a flow diagram illustrating a process to form a dual die package, according to one embodiment of the present invention.
Figures 1, 3B:
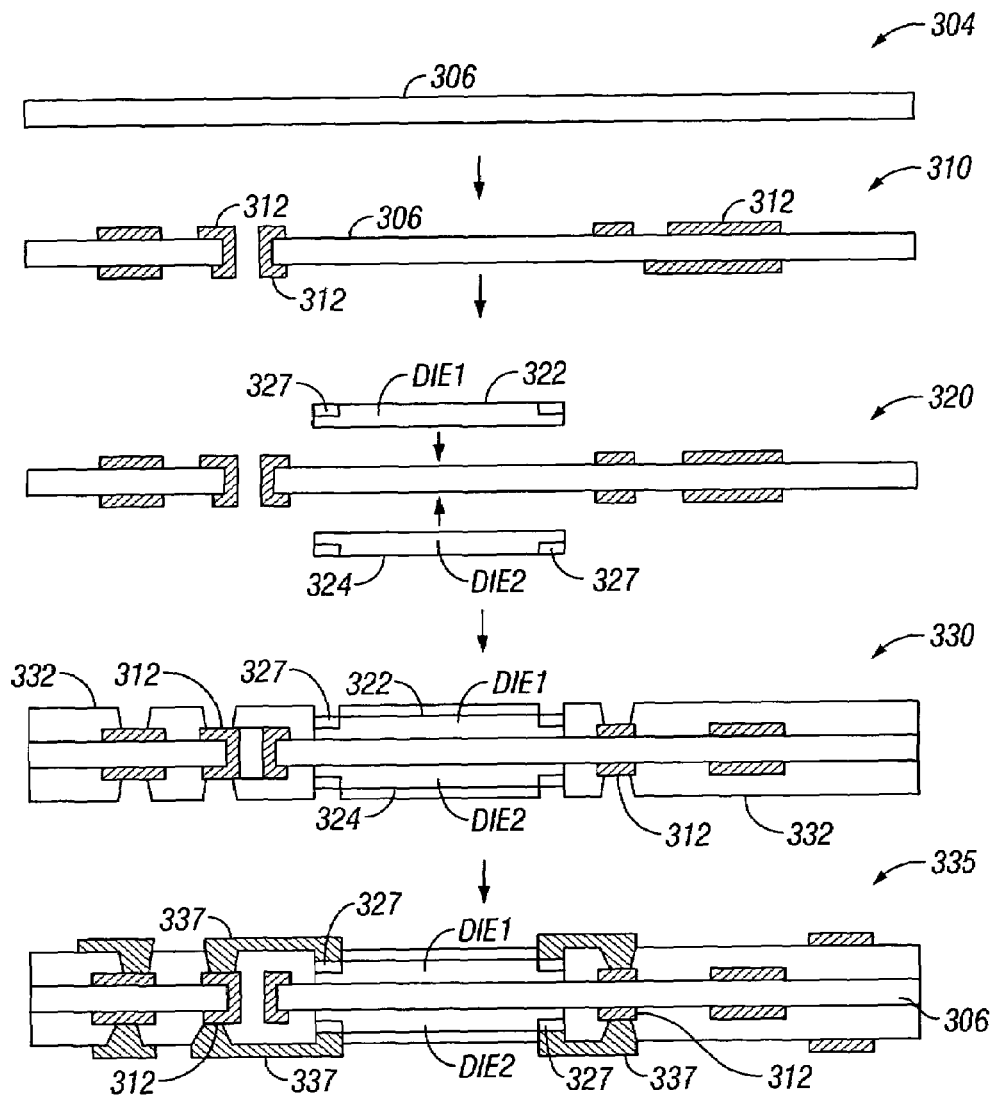
FIG. 3B is a diagram illustrating the build-up of the dual die package in accordance with the process of FIG. 3A, according to one embodiment of the present invention.
Figures 2, 3B:
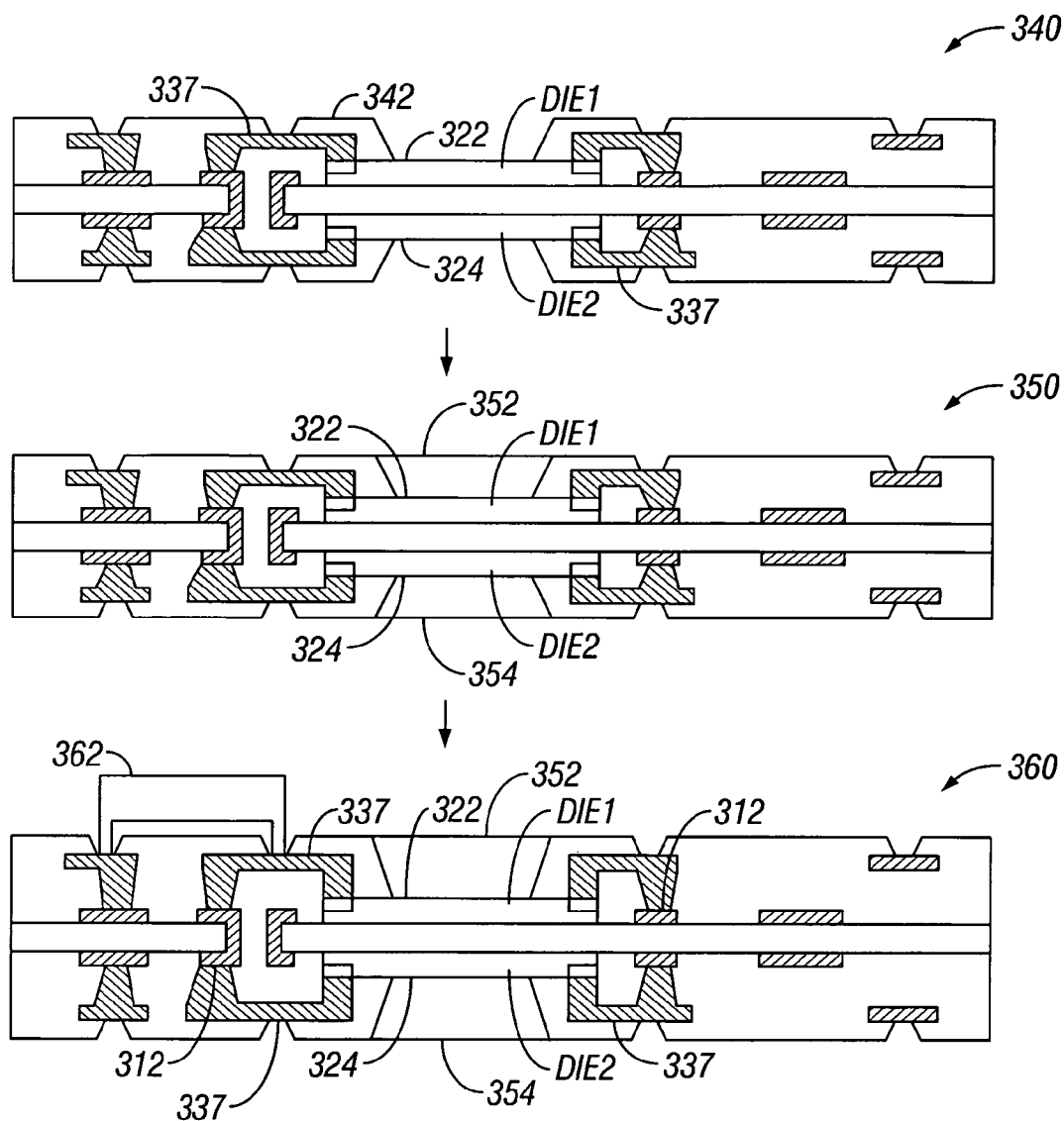

Turning now to FIGS. 3A and 3B, diagrams illustrating a process 300 to form a dual die package with a high speed interconnect, according to one embodiment of the present invention, are described. Particularly, FIG. 3A is a flow diagram illustrating operations to form the dual die package and FIG. 3B is a diagram illustrating an example of a build-up layer with first and second dice being embedded therein in accordance with the operations outlined in FIG. 3A to form the dual die package itself.

At operation block 304, a substrate 306 is prepared and positioned. The substrate 306, sometimes referred to as a base substrate, is typically an organic or dielectric layer of suitable material such as bizmaleimide trazine (BT). However, it should be appreciated, that any suitable type of organic or dielectric substrate material may be utilized. The substrate 306 provides support for the dice and appropriate routing to external contacts.

The substrate 306 is next drilled and plated (block 310). Typically, the substrate 306 is plated with copper according to an interconnection pattern. The copper forms first copper plated interconnects 312 that provide conductive paths to contact points. It should be appreciated that other conductive metals such as nickel may be utilized in place of copper.

At process block 320, die 1 322 and die 2 324 are attached to the substrate 306. Die 1 322 and die 2 324 may be attached to substrate 306 by applying an adhesive on the respective dice area and pressing the dice on the adhesive with some amount of force. As can be particularly seen in FIG. 3B, die 1 322 and die 2 324 are mounted in opposed relation on opposite sides of the substrate 306. Both the first and second dice 322 and 324 may each have die pads 327 for providing electric connections to the dice.

After die attachment, at block 330, a photo-resist layer 332 made by a dielectric material is coated or deposited on the surface of the copper plated substrate 306 and the opposed first and second dice 322 and 324. A photo-resist development process is then performed using standard techniques to etch the photo-resist layer 332 and expose contact points such as for some of the first copper plated interconnects 312 and for the die tabs 327 so that they have openings for interconnection.

Then, at block 335, a copper layer is applied such that second copper plated interconnects 337 are deposited between the previously-formed openings to provide for electrical connections between the die pads 327 and some of the first copper plated interconnects 312. This provides for substrate-to-die interconnections and for interconnections between the dice themselves. Thus, as shown in FIG. 3B, die 1 322 is electrically interconnected through second copper interconnects 337 and a first copper interconnect 312 to die 2 324 and each of the dice are also connected to the substrate 306.

Next, at block 340, a solder-resist material layer 342 made from an organic material is applied or coated on the surface of the copper plated substrate 306 and the first and second dice 322 and 324. A solder-resist development process may be performed using standard techniques to etch the solder-resist layer 342 and expose portions of the copper electrical interconnects 337 and the dice 322 and 324 with openings. Particularly, openings are provided adjacent dice 1 and 2 322 and 324 for receipt of thermal interface material, as will be discussed.

At block 350, thermal interface material (TIM) 352 and 354 may be soldered into the formed openings on both sides of the copper plated substrate adjacent to the dice 1 and 2 322 and 324, respectively. The TIM may be utilized to aid in heat conduction.

Lastly, at block 360, a decoupling capacitor (DECAP) 362 may be attached to the filly formed dual die package through openings formed therein to interconnect with second copper interconnections 337. In this way, power may be applied to both die 1 322 and die 2 324 of the dual die package.

Figure 4:
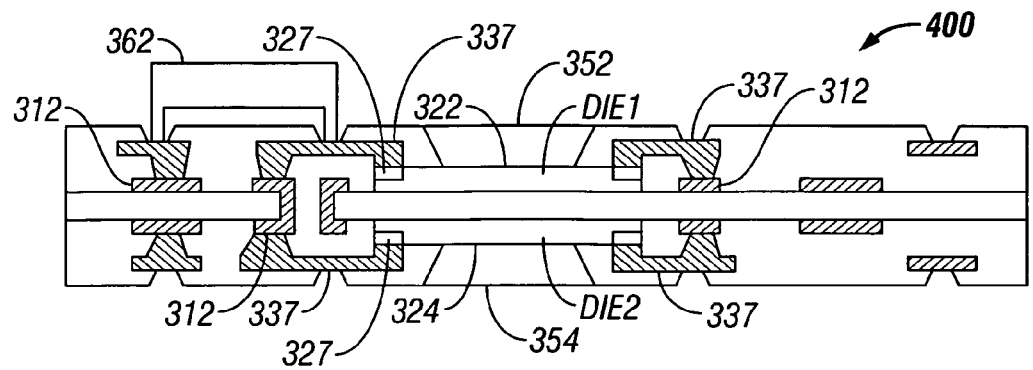
FIG. 4 is a diagram illustrating a fully formed dual die package with high-speed interconnects, according to one embodiment of the present invention.

Looking at FIG. 4, FIG. 4 is a diagram illustrating a fully formed dual die package with high-speed interconnects 400, according to one embodiment of the present invention.

As shown in FIG. 4, a dual die package 400 has been created by the previously-described process 300 having a first die 322 on a first side of a base substrate 306 and a second die 324 on a second side of the base substrate 306 in opposed relation to the first die 322. First copper plated interconnect(s) 312 are plated to the base substrate 306. Second copper interconnects 337 are formed to connect the first copper plated interconnect(s) 312 to the first and second dice 322 and 324, respectively, such that in some configurations the first and second dice are interconnected. For example, in one example, dice 322 and 324 through their respective die pads 327, second copper interconnects 337, and a first copper electrical interconnect 312, may be electrically coupled to one another.

Particularly, as can be seen in FIG. 4, first and second dice 322 and 324 are each embedded and mounted within a dual die package 400 having high speed electrical interconnects 337 and 312 that electrically interconnect each of the dice to the substrate itself and to each other, respectively. Further, the first and second dice 322 and 324 are mounted in opposed relation in a space-saving package. Moreover, thermal interface material (TIM) 352 and 354 may be mounted adjacent to each die, respectively, to aid in heat removal. DECAP 362 may be utilized to power die 1 and die 2.

Figure 5A:
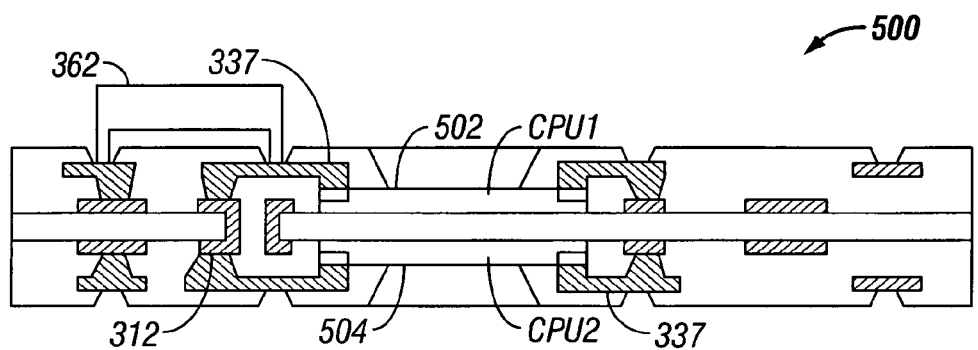
FIG. 5A is diagram illustrating a dual CPU die package, according to one embodiment of the present invention.

As shown in FIG. 5A, in one embodiment both die 1 and die 2 may be CPUs 502 and 504, respectively.

In the embodiment of FIG. 5A, wherein each of the dice are CPUs 502 and 504, a dual CPU package 500 is provided with very short interconnects and without a ball or grid assembly, such that stub effects associated with prior CPU packages are significantly reduced.

Figure 5B:
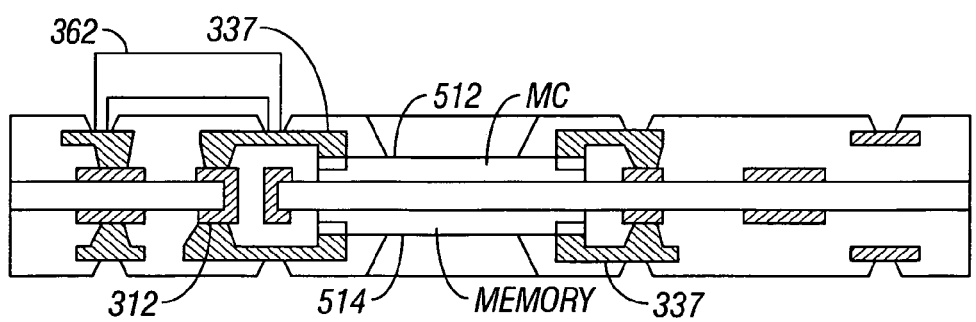
FIG. 5B is diagram illustrating a dual die package having a memory controller die and memory die, according to one embodiment of the present invention.

In another embodiment, with reference to FIG. 5B, die 1 may be a memory controller 512 and die 2 may be a high speed memory 514.

In the embodiment of FIG. 5B, where the first die is a memory controller 512 and the second die is a memory 514, the short interconnects 337 and 312 allow for the high speed and large bandwidth necessary for 3D graphics processing, as well as other high-speed memory transactions.

Because the electrical interconnects 337 and 312 are relatively short, there is a relatively small signal latency such that very high speed transmission is supported. Further, the dual die package parasitics related to inductance, resistance, and capacitance are relatively small such that electrical performance is improved. Additionally, because there are no wire bonds or flip chips, or molds, there is a great deal of cost saving in the assembly of the dual die package.

Thus, by forming dual dice in the same dual die package, as previously described, a number of advantages compared to traditional techniques (e.g., wire-bonding or flip-chip packing) may be realized. For example, the electrical response time is faster because the dice are integrated in the same package with very short connection lengths. Additionally, the resulting package occupies much less space, in terms of both area and height.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting.

What is claimed is:

1. An apparatus comprising:
    a first die on a first side of a base substrate in a package;
    a second die on a second side of the base substrate in the package in opposed relation to the first die, wherein the base substrate is drilled according to an interconnection pattern and the first die is attached to the first side of the copper plated base substrate and the second die is attached to the second side of the copper plated base substrate;
    a single copper plated interconnect plated to the base substrate;
    a photo-resist layer of a dielectric material coated on the first die and the second die and the copper plated base substrate; and
    first and second copper plating layers formed to connect the single copper plated interconnect to the first and second dice, respectively, such that the first and second dice are interconnected to one another through the single copper plated interconnect and through the photo-resist layer.

2. The apparatus of claim 1 further comprising a decoupling capacitor attached to at least one of the first and second copper plating layers to apply power to the first and second dice.

3. The apparatus of claim 1 further comprising a first thermal interface material (TIM) soldered to the first die and a second TIM soldered to the second die.

4. The apparatus of claim 1 wherein the first die includes a central processing unit (CPU) and the second die includes a central processing unit (CPU).

5. The apparatus of claim 1 wherein the first die includes a memory controller and the second die includes a memory.

6. A system comprising:
    a printed circuit board populated with components; and
    a package attached to the printed circuit board, the package comprising:
    a first die on a first side of a base substrate in a package;
    a second die on a second side of the base substrate in the package in opposed relation to the first die, wherein the base substrate is drilled according to an interconnection pattern and the first die is attached to the first side of the copper plated base substrate and the second die is attached to the second side of the copper plated base substrate;
    a single copper plated interconnect plated to the base substrate;

a photo-resist layer of a dielectric material coated on the first die and the second die and the copper plated base substrate; and first and second copper plating layers formed to connect the single copper plated interconnect to the fist first and second dice, respectively, such that the first and second dice are interconnected to one another through the single copper plated interconnect and through the photo-resist layer.

7. The system of claim 6 further comprising a decoupling capacitor attached to at least one of the first and second copper plating layers to apply power to the first and second dice.

8. The system of claim 6 further comprising a first thermal interface material (TIM) soldered to the first die and a second TIM soldered to the second die.

9. The system of claim 6 wherein the first die includes a central processing unit (CPU) and the second die includes a central processing unit (CPU).

10. The system of claim 6 wherein the first die includes a memory controller and the second die includes a memory.

* * * * *

UNITED STATES PATENT AND TRADEMARK OFFICE
CERTIFICATE OF CORRECTION

| | |
|---|---|
| PATENT NO. | : 7,511,359 B2 |
| APPLICATION NO. | : 11/321195 |
| DATED | : March 31, 2009 |
| INVENTOR(S) | : Tang et al. |

Page 1 of 1

It is certified that error appears in the above-identified patent and that said Letters Patent is hereby corrected as shown below:

In column 7, at line 5 delete, -- fist --

Signed and Sealed this

Thirtieth Day of November, 2010

David J. Kappos
*Director of the United States Patent and Trademark Office*